United States Patent [19]

Wolf et al.

[11] Patent Number: 4,717,943

[45] Date of Patent: Jan. 5, 1988

[54] CHARGE STORAGE STRUCTURE FOR NONVOLATILE MEMORIES

[75] Inventors: Hans P. Wolf, Zurich, Switzerland; Donald R. Young, Ossining, N.Y.

[73] Assignee: International Business Machines, New York, N.Y.

[21] Appl. No.: 884,671

[22] Filed: Jul. 16, 1986

Related U.S. Application Data

[63] Continuation of Ser. No. 624,432, Jun. 25, 1984.

[51] Int. Cl.[4] .................. H01L 29/76; H01L 29/12; H01L 29/14
[52] U.S. Cl. .................................. 357/23.5; 357/54; 365/185
[58] Field of Search .................. 357/23.5, 54; 365/185

[56] References Cited

U.S. PATENT DOCUMENTS

| | | | |
|---|---|---|---|
| 3,649,884 | 3/1972 | Haneta | 357/23.5 |
| 3,878,549 | 4/1975 | Yamazaki et al. | 357/54 |
| 4,253,106 | 2/1981 | Goldsmith et al. | 357/54 |
| 4,399,522 | 8/1983 | Kotecha | 357/23.5 |
| 4,471,471 | 9/1984 | DiMaria | 357/23.5 |

FOREIGN PATENT DOCUMENTS

| | | | |
|---|---|---|---|
| 0034653 | 9/1981 | European Pat. Off. | 357/23.5 |
| 0040701 | 12/1981 | European Pat. Off. | 357/23.5 |
| 0082936 | 7/1983 | European Pat. Off. | 357/23.5 |
| 0105802 | 4/1984 | European Pat. Off. | 357/23.5 |
| 57-111884 | 7/1982 | Japan | 357/23.5 |

Primary Examiner—Andrew J. James
Assistant Examiner—Jerome Jackson, Jr.
Attorney, Agent, or Firm—Sughrue, Mion, Zinn, Macpeak & Seas

[57] ABSTRACT

A four layer charge storage structure comprising alternate layers of silicon-rich silicon dioxide and silicon dioxide with electrode layers on top and bottom. The upper and middle silicon-rich layers act as enhanced Fowler-Nordheim injectors and the middle silicon-rich layer also stores charges since the silicon particles act as deep traps. The charge storage structure is applicable to nonvolatile memories.

13 Claims, 2 Drawing Figures

CHARGE STORAGE STRUCTURE FOR NONVOLATILE MEMORIES

This is a continuation of application Ser. No. 624,432 filed 6/25/84.

BACKGROUND OF THE INVENTION

This invention relates to a memory device and in particular to a charge storage structure built utilizing silicon-rich technology.

Floating gate storage FET devices are well known in the technology where a conductor, usually Si, is embedded in an insulator layer. Such memory elements store information and allow for information modification and erasure. Some floating gate devices have employed Si-rich layers as conductors for charge injection enhancement, but cannot store discrete charges in the Si-rich layers due to the presence of a conductive layer adjacent to the Si-rich region.

FET structure used for such memory elements is typified by U.S. Pat. No. 3,649,884 which utilizes a field effect transistor provided with a gate assembly. The gate assembly therein comprises a sandwich of a layer of $SiO_2$ with excess Si disposed between two insulating films of appropriate thickness for the entrapment of charge carriers in the silicon-rich $SiO_2$ layer. This triple layer is disposed between the gate electrode and the substrate. This device requires a thin, 30–40 Å, insulator on the bottom of the Si-rich layer otherwise tunneling cannot occur. However, charge leakage problems occur due to the thinness of the insulator.

Another example of an electrically alterable floating gate memory device is disclosed in U.s. Pat. No. 4,253,106. A silicon-rich oxide layer is disposed between the control gate and the floating gate.

A difficulty in prior art floating gate systems using embedded conductors is charge leakage if the structure is defective. Since the conductor can be considered an entity, charge tends to leak off eventually resulting in complete discharge and loss of the stored information. It is of course desired to have a memory device programmed to retain the information over an extended period of time until programmed without loss of charge.

Another of the difficulties of such electrically erasable programmable read only memory (EEPROM) devices is a need for significant amounts of chip real estate due to the floating gate structure.

SUMMARY OF THE INVENTION

This invention departs from the prior art by using a trap structure as the charge retention mechanism instead of a floating gate memory structure. The invention eliminates the problem of leakage since if a defect exists only traps that are locally effected will be depleted. The charge storage structure employed by this invention employs Si-rich $SiO_2$ which is effectively an insulator at low fields but a conductor at high fields, i.e., for programming the device. However, the Si-rich $SiO_2$ used in the device of this invention provides traps to store charges.

In accordance with the present invention, a new charge storage structure is defined which is classified as an intermediate between prior MNOS devices and prior floating gate devices. The storage structure comprises four layers disposed between two electrodes. The lower electrode is a Si substrate. The upper electrode is doped polysilicon or metal such as aluminium. Alternative oxide and Si-rich oxide layers define the four layer structure. In accordance with the present invention, the upper Si-rich layer acts as an enhanced Fowler-Nordheim injector. The second, or middle, Si-rich layer which is sandwiched between two oxide layers also acts as an injector at the high fields used for device programming. Importantly, this middle Si-rich layer is capable of storing a positive or negative charge because the Si particles in the oxide matrix act as deep electron traps. The two oxide layers act as insulators to prevent leakage at normal device operating conditions.

As will be set forth herein, this new charge storage structure may be used in programmable device. Circuitwise in terms of operative steps it is similar to the MNOS device. In accordance with the present invention, the MNOS gate is replaced with the structure in accordance with the present invention. However, the steps of programming, reading, and erasing are done in a manner corresponding to technology associated with MNOS cells.

This invention will be described in greater detail by referring to the attached accompanying drawing and the description of the preferred embodiments which follow.

DESCRIPTION OF THE PREFERRED EMBODIMENTS

Figure 1:
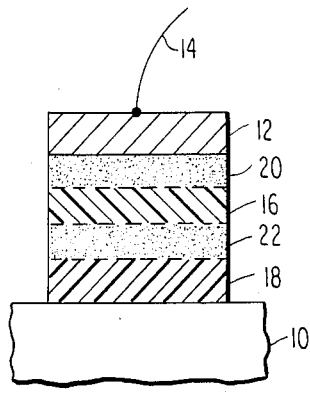
FIG. 1 is a schematic cross-sectional view of charge storage structure in accordance with the present invention.

Referring now to FIG. 1, a schematic cross-section of the charge storage structure of this invention is depicted. The structure essentially comprises four layers sandwiched between two electrodes. The lower layer 10 is a silicon substrate. The upper electrode 12 is doped polysilicon or a metallic conductor such as aluminium having shown schematically a metalization lead 14. Sandwiched between the substrate and the upper electrode is a four layer structure comprising two $SiO_2$ layers 16 and 18 and two Si-rich oxide layers 20 and 22. Si-rich oxides are known, for example, DiMaria et al, "Electrically-Alterable Read-Only-Memory Using Si-Rich $SiO_2$ Injectors and a Floating Polycristalline Silicon Storage Layer", J. Appl. Phys., 52, 4825 (1981). In accordance with the present invention, thickness of layers 16, 18, 20 and 22 is in the range of 80–300 Å. The thickness of each layer may vary as a function of fabrication parameters for optimizing a particular device to a particular application.

The upper Si-rich layer 20 acts as an enhanced Fowler-Nordheim injector (See, "Electron Emission in Intense Electric Fields", Proc. Roy. Soc. (London) 119, 173 (1928)). By enhanced Fowler-Nordheim injection, it is meant that injection takes places at a lower applied field by virtue of the excess Si in the $SiO_2$. The middle Si-rich layer 22 is sandwiched between the $SiO_2$ layers 16 and 18. It also acts as an injector but importantly is capable of storing a positive or negative charge. This phenomenon occurs because the Si particles in the oxide matrix, shown in FIG. 1, act as deep traps.

In accordance with the structure of FIG. 1, two charge storage operations are perceived; charging to a positive state and discharging to an approximately neutral state. These two charge storage operations occur as follows.

(a) charging to a positive state:

A positive voltage is applied to the upper electrode 12. Electrons move from the storage layer 22 by Fowler-Nordheim tunneling to layer 12. The flat Si-SiO$_2$ interface which exists between layers 10 and 18 results in bad injection efficiency and therefore at this field no electrons are injected from the bottom surface 10. When an external voltage is removed, the middle Si-rich layer 22 is positively charged.

(b) discharging to an approximately neutral state:

A positive voltage is applied to the bottom electrode 10. Electrons are injected from the top injector 12 into the middle Si-rich layer 22 until an approximately neutral state is achieved. Then, the field in the lower SiO$_2$ layer 18 becomes as large as that in the upper SiO$_2$ layer 16 so that the middle Si-rich layer 22 begins to inject electrons into the Si substrate 10. This results in an approximately neutral state in the middle Si-rich layer 22. As a variation of this technique of discharging to an approximately neutral state, the positive voltage on the bottom electrode 10 could be replaced by utilizing a negative voltage at the top electrode 12.

Thus, in these two charge storage operations, it can be seen that the upper Si-rich layer 20 acts as a Fowler-Nordheim injector and the middle Si-rich layer while also acting as an injector stores positive or negative charges. This basic structure can be utilized in the context of a memory cell.

Figure 2:
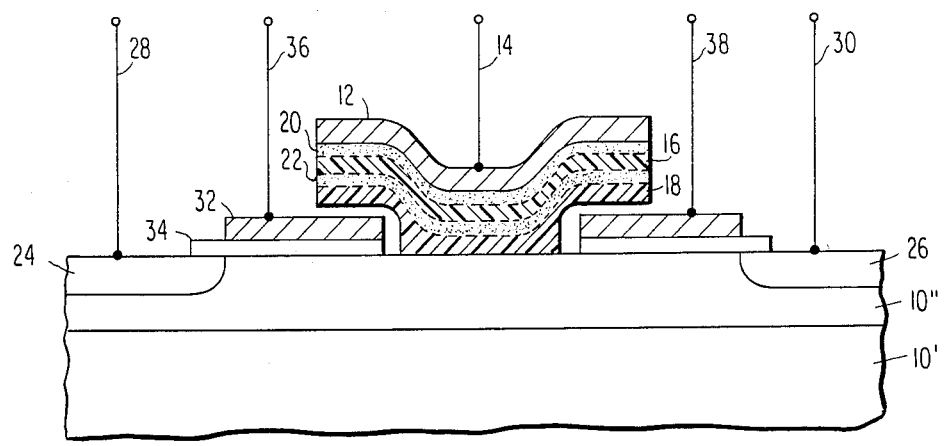
FIG. 2 is a schematic cross-sectional view of an electrically erasable programmable read-only memory utilizing the charge storage structure of FIG. 1.

FIG. 2 shows the use of the charged storage structure of FIG. 1 in the context of an electronically erasable programmable read only memory (EEPROM). As is well known, the EEPROM memory cell is a three gate structure, for example, as described in Lancaster et al, "A 5-V-Only EEPROM with Internal Program/Erase Control", 1983 IEEE Solid State Circuits Conference, Digest of Technical Papers, pp. 164–165. Such memory cells typically use metal-Si$_3$N$_4$-SiO$_2$-Si gates. These structures (See, Sze, "Physics of Semiconductor Devices", John Wiley, New York, 1981, pp. 496–506) are replaced with the charge storage structure of the present invention. As shown in FIG. 2, the EEPROM structure utilizes the charge storage structure of FIG. 1, that is SiO$_2$ layers 16 and 18 with Si-rich SiO$_2$ layers 20 and 22. Electrode 14 coupling to the doped polysilicon layer 12 forms a gate. EEPROM structure is constructed on a silicon substrate comprising typically a first layer of n-silicon having deposited thereon a second layer of silicon of an opposite conductivity type. By conventional semiconductor techniques, a source and drain region 24 and 26 are placed in the layer 10". Appropriate electrode 28 and 30 used to provide contacts to the source and drain regions. It will be appreciated that the remaining portion of this FET structure is completed by having a layer of polycrystaline silicon 32 on top of an insulating layer, such as a thermal SiO$_2$ 34. Appropriate leads 36 and 38 are used to make contact to the gate and to source and drain regions. If the structure is built on single crystalline Si, then the first oxide layer 18 can be obtained by conventional oxidation techniques. The remaining three layers are then built by CVD.

Erasing, programming and reading are done in a manner corresponding to known MNOS cells. The structure of FIG. 2 has no charge in the storage layer in its erase state. The Si layer 10" below the storage gate is in depletion. In the programmed state with positive charge in the storage layer 22, the Si layer 10" is in inversion (i.e., with zero voltage in the gate).

The EEPROM structure of FIG. 2 offers better controllability than conventional MNOS devices. The injection efficiency of the charge storage structure can be adjusted by the Si content in the Si-rich oxide layers 20 and 22. The amount of trapping in the storage layer 22 can be adjusted by its thickness and its Si content. It will be appreciated that the programming voltages required are functions of the thicknesses of the oxide layers.

This invention is also advantageous over floating gate structures since it eliminates the requirement for ultra-thin insulators. Also the problem of optimizing device switching speed as a function of charge retention common in floating gate structures is avoided due to the charge retention ability of the middle Si-rich layer.

The fabrication of the structure shown in FIG. 2 can be done utilizing chemical vapor deposition (CVD) in a manner known for double electron injector structures. DiMaria et al, supra, identify such DEIS configurations, including an electrode and Si-layer sandwich including two silicon-rich dioxide layers separated by a single SiO$_2$ layer. Manufacturing techniques of that 3-layer structure are applicable for the 4-layer structure. Efficiencies occur because the entire 4-layer structure can be fabricated in a single run by changing the gas mixtures at appropriate points in the run.

While this invention has been described in the context of a storage gate for an EEPROM, it is apparent that it may be employed in other nonvolatile memories.

Having described our invention, we claim:

1. A charge storage structure comprising:
   a silicon substrate;
   a four layer sandwich on said silicon substrate layer comprising in order, a first silicon dioxide layer, a first silicon-rich silicon dioxide layer, a second silicon dioxide layer and a second silicon-rich silicon dioxide layer, said first silicon-rich silicon dioxide layer acting as an enhanced Fowler-Nordheim injector and also storing charges as a deep trap region and the second silicon-rich silicon dioxide layer acting as an enhanced Fowler-Nordheim injector;
   said silicon-rich silicon dioxide in said first and second layers comprising a multi-phase material hving a non-ohmic conductivity; and
   a conductive layer disposed on said four layer sandwich.

2. The charge storage structure of claim 1 further comprising electrode means attached to said substrate and said conductive layer.

3. The charge storage structure of claim 1 wherein said conductive layer is doped polysilicon.

4. The charge storage structure of claim 1 wherein said conductive layer is a metal such as aluminium.

5. The charge storage structure of claim 1 wherein each layer of said four layer sandwich has a thickness in the range of 80–300 Å.

6. The charge storage structure of claim 1 further comprising source and drain regions disposed in substrate, said four layer sandwich and said conductive layer positioned between said source and drain as a storage region thereby defining a storage device.

7. The charge storage structure of claim 6 wherein said silicon substrate comprises a P type silicon substrate with N type source and drains.

8. The charge storage structure of claim 6 further comprising first said second gates respectively placed between said source and said storage region and said storage region and said drain.

9. A storage structure comprising:
a silicon substrate;
a four layer sandwich on said silicon substrate comprising alternate layers of silicon dioxide and silicon-rich silicon dioxide, one silicon-rich silicon dioxide layer acting as an enhanced Fowler-Nordheim injector and also storing charges as a deep trap region and the other silicon-rich layer acting as an enhanced Fowler-Nordheim injector; said silicon-rich silicon dioxide in said first and second layers comprising a multi-phase material having a non-ohmic conductivity; and
a conductive layer disposed on said four layer sandwich.

10. The charge storage structure of claim 9 further comprising electrode means attached to said silicon substrate and said conductive layer.

11. The charge storage structure of claim 9 wherein said conductive layer is doped polysilicon.

12. The charge storage structure of claim 9 wherein conductive layer is a metal such as aluminium.

13. The charge storage structure of claim 9 wherein each layer of said four layer sandwich has a thickness in the range of 80–300 Å.

* * * * *